United States Patent [19]
Iyechika et al.

[11] Patent Number: 6,023,077
[45] Date of Patent: *Feb. 8, 2000

[54] GROUP III-V COMPOUND SEMICONDUCTOR AND LIGHT-EMITTING DEVICE

[75] Inventors: Yasushi Iyechika; Yoshinobu Ono; Tomoyuki Takada; Katsumi Inui, all of Ibaraki, Japan

[73] Assignee: Sumitomo Chemical Company, Limited, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/757,981

[22] Filed: Nov. 27, 1996

[30] Foreign Application Priority Data

| Nov. 27, 1995 | [JP] | Japan | 7-307282 |
| Mar. 22, 1996 | [JP] | Japan | 8-066248 |
| Sep. 6, 1996 | [JP] | Japan | 8-236845 |

[51] Int. Cl.$^7$ .................................................. H01L 33/00
[52] U.S. Cl. .......................... 257/103; 257/190; 257/615; 438/46
[58] Field of Search ......................... 257/103, 94, 190, 257/615; 438/46

[56] References Cited

U.S. PATENT DOCUMENTS

| 4,484,207 | 11/1984 | Nishizawa et al. | 257/200 |
| 5,247,533 | 9/1993 | Okazaki et al. | 372/45 |
| 5,578,839 | 11/1996 | Nakamura et al. | 257/613 |
| 5,583,879 | 12/1996 | Yamazaki et al. | 372/45 |

FOREIGN PATENT DOCUMENTS

| 0599224A1 | 6/1994 | European Pat. Off. |
| 0675552A1 | 10/1995 | European Pat. Off. |
| 0716457A2 | 6/1996 | European Pat. Off. |
| 621511 | 1/1994 | Japan |
| 7302929 | 11/1995 | Japan |

OTHER PUBLICATIONS

"High–Brightness InGaN Blue, Green and Yellow Light–Emitting Diodes with Quantum Well Structures", by S. Nakamura et al., Jpn. J. Appl. Phys. vol. 34 (1995) pp. L797–L799, part 2, No. 7A, Jul. 1, 1995.

"Candela–class high–brightness InGaN/AlGaN double–heterostructure blue–light–emitting diodes" by S. Nakamura et al., Appl. Phys. Lett. 64 (13) Mar. 28, 1994, pp. 1687–1689.

"$In_xGa_{(1-x)}N/In_yGa_{(1-y)}N$ superlattices grown on GaN films" by S. Nakamura et al., J. Appl. Phys. 74(6) Sep. 15, 1993 pp. 3911–3915.

"Room–temperature violet stimulated emission from optically pumped ALGaN/GaLnN double heterostructure", by H. Amano et al., Appl. Phys. Lett. 64 (11) Mar. 14, 1994 pp. 1377–1379.

"Superbright Green InGaN Single–Quantum–Well–Structure Light–Emitting Diodes", by S. Nakamura et al., Jpn. J. Appl. Phys. vol. 34 (1995) pp. L1332–L1335, Part 2, No. 10B, Oct. 15, 1995.

"InGaN–Based Multi–Quantum Well–Structure Laser Diodes" by S. Nakamura et al., Jpn. J. Appl. Phys. vol. 35 (1996) pp. L74–L76 Part 2, No. 1B, Jan. 15, 1996.

Primary Examiner—Mark V. Prenty
Attorney, Agent, or Firm—Birch, Stewart, Kolasch & Birch, LLP

[57] ABSTRACT

A Group III-V compound semiconductor of high crystallinity and high quality, and a light-emitting device using the same, which has high luminous efficacy are obtained by providing a specific ground layer composed of at least three layers between the luminous layer and substrate. A light-emitting device capable of inhibiting formation of a misfit dislocation on the interface of the luminous layer and easily emitting light having a longer wavelength is also obtained by controlling the AlN mixed crystal ratio of at least one layer between the luminous layer and the substrate within a specific range and controlling the lattice constant of the luminous layer to a value larger than that of the ground layer, the luminous layer having a compressive strain formed in contact with the ground layer.

12 Claims, 2 Drawing Sheets

GROUP III-V COMPOUND SEMICONDUCTOR AND LIGHT-EMITTING DEVICE

BACKGROUND OF THE INVENTION

1. Field of the Invention

The present invention relates to a Group III-V compound semiconductor represented by the general formula $In_uGa_vAl_wN$ (provided that $u+v+w=1$, $0 \leq u \leq 1$, $0 \leq v \leq 1$, and $0 \leq w \leq 1$), and a light-emitting device using the same.

2. Description of Related Art

As a material of light-emitting devices such as ultraviolet or blue light-emitting diodes, ultraviolet or blue laser diodes, etc., a Group III-V compound semiconductor represented by the general formula $In_xGa_yAl_zN$ (provided that $x+y+z=1$, $0<x \leq 1$, $0 \leq y<1$, and $0 \leq z<1$) has been known. Hereinafter, x, y and z in this general formula are sometimes referred to as an "InN mixed crystal ratio, a "GaN mixed crystal ratio" and an "AlN mixed crystal ratio", respectively. Particularly, Group III-V compound semiconductors containing InN in a mixed crystal ratio of not less than 10% are important for display applications because the luminescence wavelength in the visible range can be adjusted according to the InN mixed crystal ratio.

However, the compound semiconductor and light-emitting devices using the same had the following problems.

First, a trial of forming a film of the Group III-V compound semiconductor on various substrates (e.g. sapphire, GaAs, ZnO, etc.) has been made. However, a crystal having sufficiently high quality is still to be obtained because the lattice constants and chemical properties of the substrates are quite different from those of the compound semiconductor. Therefore, a trial of firstly growing a crystal of GaN whose lattice constants and chemical properties are strikingly similar to those of the compound semiconductor and growing the compound semiconductor thereon to obtain an excellent crystal has been made (Japanese Patent Kokoku No. 55-3834). It has recently been reported that a high-efficacy light-emitting device can be realized by controlling the thickness of a luminous layer to about 20 Å in a light-emitting device comprising a semiconductor represented by $In_xGa_yN$ (provided that $x+y=1$, $0<x<1$, and $0<y<1$) as an active layer (Japanese Journal of Applied Physics, 1995, Vol. 34, page L797). In this case, however, it has also been reported that the luminous efficacy is lowered as the InN mixed crystal ratio of the luminous layer is increased.

Second, the lattice constant of the Group III-V compound semiconductor depends largely on the InN mixed crystal ratio and the lattice constant becomes larger as the InN mixed crystal ratio increases. Therefore, even if a trial of growing the Group III-V compound semiconductor having a large InN mixed crystal ratio on a Group III-V compound semiconductor containing no In (e.g. GaN, etc.) is made, only those having sufficiently small film thickness show good crystallinity. However, it has been known that it is difficult to obtain a crystal having a lattice constant which is largely different from that of a ground layer because of a so-called self regulation effect of the mixed crystal ratio to lattice matching when the film thickness is small. That is, this fact shows that it is difficult to form a thin film of the compound semiconductor having high InN mixed crystal ratio on the semiconductor layer containing no In (e.g. GaN, etc.). Accordingly, it has been difficult to lengthen the wavelength of the light-emitting device by increasing the InN mixed crystal ratio.

On the other hand, as a process of obtaining a light-emitting device having a long luminescence wavelength by using a luminous layer having a low InN mixed crystal ratio, there has been suggested a process of substantially lengthening the luminescence wavelength by applying a tensile stress to a luminous layer in a light-emitting device comprising a quantum well structure using the Group III-V compound semiconductor as the luminous layer (EP-A-0716457 specification). In order to apply the tensile stress to the compound semiconductor having a lattice constant larger than that of the ground layer, however, it can not be avoided to form a lot of misfit dislocations on the interface between the ground layer and luminous layer and, therefore, deterioration of the crystallinity of the luminous layer could not be avoided. The term "misfit dislocation" used herein means a dislocation formed on the interface between two layers because of a difference in lattice constant between two layers laminated to each other.

SUMMARY OF THE INVENTION

The first object of the present invention is to provide a Group III-V compound semiconductor of high crystallinity and high quality, and a light-emitting device using the same, which has high luminous efficacy.

The second object of the present invention is to provide a light-emitting device capable of inhibiting formation of a misfit dislocation on the interface of the luminous layer and easily emitting light having a longer wavelength.

Under these circumstances, the present inventors have conducted intensive studies. As a result, it has been found that, by providing a specific ground layer composed of at least three layers between the luminous layer and substrate, the crystallinity of a layer grown on the ground layer is remarkably improved.

It has also been found that, by controlling the AlN mixed crystal ratio of at least one layer between the luminous layer and the substrate within a specific range add and controlling the lattice constant of the luminous layer to a value larger than that of the ground layer, a luminous layer having a compressive strain is formed in contact with the ground layer, thereby inhibiting formation of the misfit dislocation and lengthening the luminescence wavelength.

That is, the first part of the present invention relates to a Group III-V compound semiconductor (1) comprising at least a luminous layer and a charge injection layer on a substrate, the luminous layer being a Group III-V compound semiconductor represented by the general formula $In_xGa_y-Al_zN$ (provided that $0<x \leq 1$, $0 \leq y<1$, $0 \leq z<1$, and $x+y+z=1$), the charge injection layer being a group III-V compound semiconductor which is represented by the general formula $In_{x'}Ga_{y'}Al_{z'}N$ (provided that $0 \leq x'1$, $0 \leq y' \leq 1$, $0 \leq z' \leq 1$, and $x'+Y'+z'=1$) and has a band gap larger than that of the luminous layer, the luminous layer being interposed between two charge injection layers in contact with them, which is characterized by having a ground layer composed of at least three layers between the luminous layer and substrate, each layer constituting the ground layer being a Group III-V compound semiconductor represented by the general formula $In_uGa_vAl_wN$ (provided that $0 \leq u \leq 1$, $0 \leq v \leq 1$, $0 \leq w \leq 1$, and $u+v+w=1$), at least one layer in the ground layer being interposed between two layers having an InN mixed crystal ratio smaller than that of the layer in contact with them, the InN mixed crystal ratio of the layer interposed between the two layers having a smaller InN mixed crystal ratio being 0.05 or more larger than that of a layer in contact with the layer from the substrate side, and at least one layer between the layer at the substrate side among the two layers having a smaller InN mixed crystal ratio and the luminous layer being doped with an n type impurity.

The present invention also relates to a light-emitting device (2) using the Group III-V compound semiconductor of the above (1).

The second part of the present invention also relates to a light-emitting device comprising a structure that a ground layer of a Group III-V compound semiconductor represented by the general formula $In_aGa_bAl_cN$ (provided that $0 \leq a<1$, $0<b<1$, $0.05 \leq c<1$, and $a+b+c=1$), a luminous layer of a Group III-V compound semiconductor which is represented by the general formula $In_xGa_yAl_zN$ (provided that $0<x \leq 1$, $0 \leq y<1$, $0 \leq z<1$, and $x+Y+z=1$) and has a band gap smaller than that of the ground layer, and a protective layer of a Group III-V compound semiconductor which is represented by the general formula $In_a'Ga_b'Al_c'N$ (provided that $0 \leq a'<1$, $0<b' \leq 1$, $0 \leq c'<1$, and $a'+b'+c'=1$) and has a band gap larger than that of the luminous layer are laminated to each other in this order. The lattice constant of the luminous layer is larger than that of the ground layer and a compressive stress is applied to the luminous layer in the joining direction.

DETAILED DESCRIPTION OF THE INVENTION

Figure 1:
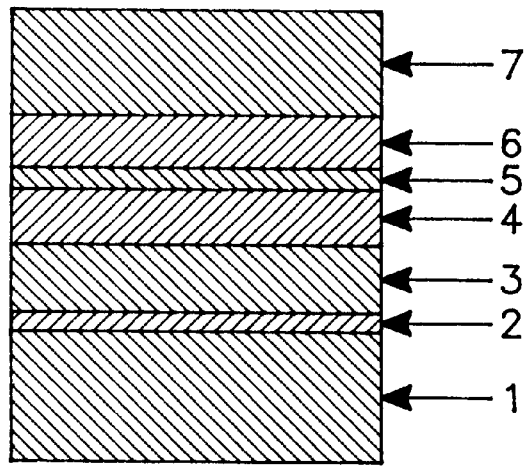
FIG. 1 is a sectional view illustrating one embodiment of the Group III-V compound semiconductor of the present invention.

The present invention will be explained in detail, hereinafter.

First, the first part of the present invention will be explained.

The Group III-V compound semiconductor in the present invention comprises a ground layer and a layer of quantum well structure on a substrate in this order. The quantum well structure refers to one in which a layer (hereinafter sometimes referred to as a "luminous layer"), represented by the general formula $In_xGa_yAl_zN$ (provided that $x+y+z=1$, $0<x \leq 1$, $0 \leq y<1$, and $0 \leq z<1$) is interposed between layers (hereinafter referred to as a "charge injection layer") which are represented by the general formula $In_x'Ga_y'Al_z'N$ (provided that $0 \leq x' \leq 1$, $0 \leq y' \leq 1$, $0 \leq z' \leq 1$, and $x'+Y'+z'=1$) and have a band gap larger than that of the luminous layer in contact with them, and further provided that x', y' and z' in the general formula representing two charge injection layers may be the same or different.

The ground layer in the present invention is composed of at least three layers and all layers are represented by the general formula $In_uGa_vAl_wN$ (wherein $0 \leq u \leq 1$, $0 \leq v \leq 1$, $0 \leq w \leq 1$, and $u+v+w=1$), provided that u, v and w in the general formula representing at least three layers in the ground layer may be the same or different.

In the ground layer in the present invention, at least one layer in the ground layer is interposed between two layers having an InN mixed crystal ratio smaller than that of this layer in contact with them.

The layer interposed between layers having a smaller InN mixed crystal ratio in the ground layer in the present invention is sometimes referred to as a "strained layer".

Comparing the strained layer with the layer in contact with the strained layer from the substrate side, a difference in InN mixed crystal ratio between the strained layer and the layer in contact with the strained layer from the substrate side is not less than 0.05, more preferably not less than 0.1, most preferably not less than 0.2. When the difference in mixed crystal ratio is smaller than 0.05, the effect of the present invention is not sufficient.

The thickness of the strained layer is preferably not less than 5 Å. When the thickness of the strained layer is smaller than 5 Å, the effect of the present invention is not sufficient.

Since the strained layer has a lattice strain, defects are formed sometimes when the thickness is too large. In this case, the crystallinity of a layer grown on the strained layer is deteriorated after all, and it is not preferred. The preferred upper limit of the thickness of the strained layer depends on a difference in InN mixed crystal ratio between the strained layer and the layer grown before the strained layer. Specifically, the thickness of the strained layer is preferably not more than 600 Å when the difference in InN mixed crystal ratio is 0.05. The thickness of the strained layer is preferably not more than 100 Å when the difference in InN mixed crystal ratio is 0.3. That is, the product of the difference in mixed crystal ratio and thickness (Å) of the strained layer is preferably not more than 30 when the difference in InN mixed crystal ratio is not more than 0.3.

The thickness of the strained layer is preferably not more than 100 Å when the difference in InN mixed crystal ratio exceeds 0.3.

Although the effect of the present invention can be obtained when the number of the strained layer is one, a larger effect can be sometimes obtained by using a plurality of strained layers. Examples of the ground layer include a structure of (2m+1) layers comprising m layers having a larger InN mixed crystal ratio and (m+1) layers having a smaller InN mixed crystal ratio which are laminated to each other. In addition, m is a positive integer of not less than 2.

In the ground layer of the laminated structure containing a plurality of these strained layers, the InN mixed crystal ratio may be changed little by little or not changed while maintaining the thickness of each strained layer. The thickness of the layer may be changed little by little unless the thickness exceeds the critical film thickness while maintaining the InN mixed crystal ratio of each strained layer.

In the layers having an InN mixed crystal ratio smaller than that of the strained layer, the InN mixed crystal ratio or thickness of the layers may be changed little by little, or may be the same as it is.

It is possible to remarkably improve the crystallinity of a layer grown on the ground layer by providing this ground layer containing the strained layer between the luminous layer and substrate. Although this effect is also recognized when the compound semiconductor is grown at atmospheric pressure using an organometallic vapor phase epitaxy process described hereinafter, the effect is remarkable when growing under a reduced pressure.

The crystallinity can be recognized by the density of etch pits formed on the surface of the compound semiconductor treated with a heated mixed acid of phosphoric acid and sulfuric acid. It is considered that the ground layer inhibits transmission of dislocations which are present in the compound semiconductor crystal because the effect of the ground layer appears as a decrease in etch pit density.

Furthermore, the present invention is characterized in that at least one layer between the layer at the substrate side among the two layers having a smaller InN mixed crystal ratio and the luminous layer is doped with an n type impurity. Specific examples thereof include those wherein the strained layer or layer having a smaller InN mixed crystal ratio grown on the strained layer is doped with an n type impurity.

Using the structure described above, it is possible to avoid that carriers injected are recombined in the strained layer and that the recombination efficacy in the luminous layer is lowered even if the band gap of the strained layer becomes smaller than that of the layer to be joined with the strained layer, because the InN mixed crystal ratio of the strained layer is higher than that of the layer to be joined with the strained layer.

A preferred concentration of carriers of the n type doped layer is not less than $1\times10^{17}$ cm$^{-3}$, preferably not less than $1\times10^{18}$ cm$^{-3}$.

One embodiment of the structure of the Group III-V compound semiconductor of the present invention is shown in FIG. 1. The embodiment shown in FIG. 1 is that in which a ground layer of a strained layer 2, an n type layer 1 and an n type layer 3, a layer of a quantum well structure wherein two charge injection layers 4, 6 sandwich a luminous layer 5 in contact with it and a p type layer 7 are laminated to each other in this order.

A current is injected by providing an n electrode on the n type layer 1 or n type layer 3, providing a p electrode on the p type layer 7 and then applying a voltage in the forward direction, thereby obtaining an emission from the luminous layer 5 and a light-emitting device of the present invention.

When the concentration of n type carriers in the charge injection layer 4 is sufficiently high, the n electrode may be formed on the charge injection layer 4.

When the band gap of the n type layer 3 is larger than that of the luminous layer, the n type layer 3 may also serve as the charge injection layer without distinguishing the n type layer 3 from the charge injection layer 4 as another layer, and the charge injection layer 4 may not be grown.

When the concentration of p type carriers in the charge injection layer 6 is sufficiently high, an electrode may be formed on the charge injection layer 6. In this case, the p type layer 7 may not be formed.

When the charge injection layer 4 or charge injection layer 6 is doped in high concentration, the crystallinity of these layers is sometimes deteriorated. In this case, the luminous characteristics or electrical characteristics are deteriorated, and this is not preferred. In this case, it is necessary to reduce the concentration of impurities in the charge injection layer 4 or charge injection layer 6. The concentration range where the crystallinity is not deteriorated is preferably not more than $1\times10^{18}$ cm$^{-3}$, more preferably not more than $1\times10^{17}$ cm$^{-3}$.

It has been known that those having comparatively high quality can be easily obtained for the compound semiconductor containing no In by using a proper buffer layer, in comparison with the compound semiconductor containing In. Therefore, it is preferred to grow the charge injection layer and luminous layer on the layer containing no In on the substrate. However, when using the layer containing In as the charge injection layer, defects are sometimes formed in the charge injection layer due to lattice mismatch between the charge injection layer and the layer containing no In which was previously grown on the substrate. In this case, formation of defects in the charge injection layer can be inhibited by interposing the ground layer of the invention between the layer containing no In which is previously grown and the charge injection layer.

Next, the luminous layer will be explained.

Since the lattice constant of the Group III-V compound semiconductor varies largely depending on the mixed crystal ratio, the thickness of the luminous layer is preferably reduced according to the amount of the strain formed by lattice mismatch when there is a large difference in lattice constant between the luminous layer and charge injection layer of the Group III-V compound semiconductor.

The preferred range of the thickness of the luminous layer depends on the amount of the strain. When the luminous layer having the InN mixed crystal ratio of not less than 10% is laminated on the layer represented by $Ga_aAl_bN$ (provided that a+b=1, $0\leq a\leq 1$, and $0\leq b\leq 1$) as the charge injection layer, the preferred thickness of the luminous layer is within the range from 5 to 90 Å. When the thickness of the luminous layer is smaller than 5 Å, the luminous efficacy becomes insufficient. On the other hand, when the thickness is larger than 90 Å, defects are formed and the luminous efficacy also becomes insufficient.

Since charges can be injected into the luminous layer in high density by reducing the thickness of the luminous layer, the luminous efficacy can be improved. Therefore, it is preferred to control the thickness of the luminous layer within the same range as that of the above embodiment even if the difference in lattice constant is smaller than that of the above embodiment.

When the luminous layer contains Al, impurities such as oxygen are easily incorporated and the luminous efficacy is sometimes lowered. In this case, there can be used those, which are represented by the general formula $In_xGa_yN$ (provided that x+y=1, $0<x\leq 1$, and $0\leq y<1$) and contain no Al, as the luminous layer.

A difference in band gap between the charge injection layer and luminous layer is preferably not less than 0.1 eV. When the difference in band gap between the charge injection layer and luminous layer is smaller than 0.1 eV, injection of carries into the luminous layer is not sufficient and the luminous efficacy is lowered. More preferably, it is not less than 0.3 eV. On the other hand, when the band gap of the charge injection layer exceeds 5 eV, the voltage required for charge injection becomes high and, therefore, the band gap of the charge injection layer is preferably not more than 5 eV.

The thickness of the charge injection layer is preferably from 10 to 5000 Å. Even if the thickness of the charge injection layer is smaller than 5 Å or larger than 5000 Å, the luminous efficacy is lowered and, therefore, it is not preferred. More preferably, it is within the range from 10 to 2000 Å.

The luminous layer may be composed of a single layer or a plurality of layers. Examples of such a structure include a laminated structure of (2n+1) layers, wherein n luminous layers and (n+1) layers having a band gap larger than that of the luminous layers are alternatively laminated, provided that n is a positive integer and is preferably from 1 to 50, more preferably from 1 to 30. When n is not less than 50, the luminous efficacy is lowered and it takes a long time to grow and, therefore, it is not preferred. Such a structure having a plurality of luminous layers is particularly useful for the case of making a semiconductor laser to which a strong light output is required.

It is possible to emit light having a wavelength, which is different from that of the band gap of the luminous layer, by doping the luminous layer with impurities. This is referred to as an "impurity emission" because of an emission from impurities. In case of the impurity emission, the luminescence wavelength varies depending on the composition of the Group III element and impurity element of the luminous layer. In this case, the InN mixed crystal ratio of the luminous layer is preferably not less than 5%. When the InN mixed crystal ratio is smaller than 5%, almost all of the light emitted is ultraviolet light and it is impossible to feel a sufficient brightness. The luminescence wavelength becomes longer as the InN mixed crystal ratio increases and the luminescence wavelength can be adjusted from violet to blue, then green.

As the impurity suitable for the impurity emission, Group II elements are preferred. When doping Mg, Zn or Cd among the Group II elements, the luminous efficacy is high and, therefore, it is preferred. Zn is particularly preferred. The concentration of these elements is preferably within the range from $10^{18}$ to $10^{22}$ cm$^{-3}$. The luminous layer may be simultaneously doped with Si or Ge, together with these Group II elements. The concentration of Si or Ge is preferably within the range from $10^{18}$ to $10^{22}$ cm$^{-3}$.

In case of the impurity emission, the emission spectrum generally becomes broad. As the amount of the injected charge increases, the emission spectrum sometimes shifts. Therefore, when high color purity is required or when it is necessary to concentrate a luminous power within the narrow wavelength range, a band-edge emission is utilized. It is preferred to reduce the amount of impurities contained in the luminous layer so as to realize a light-emitting device due to the band-edge emission. Specifically, the concentration of elements such as Si, Ge, Mg, Cd and Zn is preferably not more than $10^{19}$ cm$^{-3}$, more preferably not more than $10^{18}$ cm$^{-3}$.

When using the band-edge emission, the luminous efficacy depends on defects in the luminous layer and is lowered as the amount of defects becomes larger. Therefore, it is necessary to reduce the amount of defects in the luminous layer as small as possible. Accordingly, the ground layer in the present invention has a large effect for improving the luminous efficacy of the band-edge type light-emitting device.

In the Group III-V compound semiconductor, when the InN mixed crystal ratio of the luminous layer is high, the thermal stability is not sufficient and deterioration of the semiconductor sometimes arises during the crystal growth or semiconductor process. For the purpose of preventing such deterioration, a function as a protective layer can be imparted to the charge injection layer 6 having a small InN mixed crystal ratio by laminating the charge injection layer on the luminous layer having a high mixed crystal ratio (hereinafter the charge injection layer in this case is sometimes referred to as a "protective layer"). The mixed crystal ratio of InN and AlN of the protective layer is preferably not more than 10% and not less than 5%, respectively, so as to impart a sufficient protective function to the protective layer. More preferably, the InN mixed crystal ratio is not more than 5% and AlN mixed crystal ratio is not less than 10%.

The thickness of the protective layer is preferably from 10 Å to 1 μm so as to impart a sufficient protective function to the protective layer. When the thickness of the protective layer is smaller than 10 Å, a sufficient effect can not be obtained. On the other hand, when the thickness is larger than 1 μm, the luminous efficacy is lowered and, therefore, it is not preferred. More preferably, it is within the range from 50 to 5000 Å.

It is preferred that the protective layer has a p type conductivity in view of the efficacy of current injection into the light-emitting device. It is necessary to dope with an acceptor type impurity in high concentration so as to impart the p type conductivity to the protective layer. Specific examples of the acceptor type impurity include Group II elements. Among them, Mg and Zn are preferred, more preferably Mg. When the protective layer is doped with the impurity in high concentration, the crystallinity of the protective layer is deteriorated and the characteristics of the light-emitting device are sometimes deteriorated after all. The concentration range of the impurity where the crystallinity is not deteriorated is preferably not more than $1 \times 10^{19}$ cm$^{-3}$, more preferably not more than $1 \times 10^{18}$ cm$^{-3}$.

Next, the substrate used in the present invention and growing process will be explained.

As the substrate for growing a crystal of the Group III-V compound semiconductor, for example, sapphire, ZnO, GaAs, Si, SiC, NGO (NdGaO$_3$), spinel (MgAl$_2$O$_4$) and the like are used. Since sapphire is transparent and a crystal having large area and high quality can be obtained, it is important.

In the growth using these substrates, a semiconductor (e.g. GaN, AlN, GaAlN, InGaAlN, etc.) having high crystallinity can be grown by a so-called two-step growth in which a thin film such as ZnO, SiC, GaN, AlN, GaAlN, etc., or a lamination of these films on the substrate is utilized as a buffer layer, and it is preferred.

Examples of the process of producing the Group III-V compound semiconductor include the molecular beam epitaxy (hereinafter sometimes referred to as "MBE") process, the organometallic vapor phase epitaxy (hereinafter sometimes referred to as "MOVPE") process, the hydride vapor phase epitaxy (hereinafter sometimes referred to as "HVPE") process and the like. When using the MBE process, a gas source molecular beam epitaxy (hereinafter sometimes referred to as "GSMBE") process, which is a process of feeding a nitrogen raw material (e.g. nitrogen gas, ammonia, other nitrogen compounds, etc.) in the gas state is normally used. In this case, a nitrogen atom may not be easily incorporated into the crystal because the nitrogen raw material is chemically inert. In that case, the incorporation efficacy of nitrogen can be increased by exciting the nitrogen raw material with microwaves and feeding it in the activated state.

Next, the production process according to the MOVPE process of the Group III-V compound semiconductor of the present invention will be explained.

In case of the MOVPE process, the following raw materials can be used.

That is, examples of the Group III raw material include trialkylgallium represented by the general formula $R_1R_2R_3Ga$ (wherein R1, R2 and R3 respectively represent a lower alkyl group), such as trimethylgallium [(CH$_3$)$_3$Ga, hereinafter sometimes referred to as "TMG")], triethylgallium [(C$_2$H$_5$)$_3$Ga, hereinafter sometimes referred to as "TEG")] and the like; trialkylaluminum represented by the general formula $R_1R_2R_3Al$ (wherein R$_1$, R$_2$ and R$_3$ are as defined above), such as trimethylaluminum [(CH$_3$)$_3$Al], triethylaluminum [(C$_2$H$_5$)$_3$Al, hereinafter sometimes referred to as "TEA")], triisobutylaluminum [(i—C$_4$H$_9$)$_3$Al] and the like; trimethylaminealane [(CH$_3$)$_3$N:AlH$_3$]; trialkylindium represented by the general formula $R_1R_2R_3In$ (wherein R$_1$, R$_2$ and R$_3$ are as defined above), such as trimethylindium [(CH$_3$)$_3$In, hereinafter sometimes referred to as "TMI")], triethylindium [(C$_2$H$_5$)$_3$In] and the like. These are used alone or in combination thereof.

Examples of the Group V raw material include ammonia, hydrazine, methylhydrazine, 1,1-dimethylhydrazine, 1,2-dimethylhydrazine, t-butylamine, ethylenediamine and the like. These are used alone or in combination thereof. Among these raw materials, ammonia and hydrazine are preferred because they contain no carbon atom in the molecule and cause little contamination of carbon into the semiconductor.

As the p type dopant of the Group III-V compound semiconductor, Group II elements are important. Specific examples thereof include Mg, Zn, Cd, Hg, Be and the like. Among them, Mg is preferred because a p type one having low resistance is easily made.

As the raw material of the Mg dopant, an organometallic compound represented by the general formula $(RC_5H_4)_2Mg$ (provided that R represents hydrogen or a lower alkyl group having 1 to 4 carbon atoms) (e.g. biscyclopentadienyl magnesium, vinylmethylcyclopentadienyl magnesium, bis-ethylcyclopentadienyl magnesium, bis-n-propylcyclopentadienyl magnesium, bis-i-propylcyclopentadienyl magnesium, etc.) is preferred because of its suitable vapor pressure.

As the n type dopant of the Group III-V compound semiconductor, Group IV elements and Group VI elements are important. Specific examples thereof include Si, Ge and O. Among them, Si is particularly preferred because an n type one having low resistance is easily made and those having high raw material purity are obtained. As the raw material of the Si dopant, silane ($SiH_4$), disilane ($Si_2H_6$), monomethylsilane ($CH_3SiH_3$) and the like are preferred.

Examples of the growing device according to the MOVPE process, which can be used for the production of the Group III-V compound semiconductor, include a single-wafer reactor, multi-wafer reactor and the like. In case of the multi-wafer reactor, it is preferred to grow under reduced pressure so as to maintain the uniformity of an epitaxial film in the wafer surface. The preferred range of the growing pressure in the multi-wafer reactor is from 0.001 to 0.8 atm.

As the carrier gas, there can be used gases such as hydrogen, nitrogen, argon, helium and the like alone or in combination thereof. When hydrogen is contained in the carrier gas, a sufficient crystallinity is not obtained sometimes when growing the compound semiconductor having a high InN mixed crystal ratio. In this case, it is necessary to reduce the partial pressure of hydrogen in the carrier gas. The preferred partial pressure of hydrogen in the carrier gas is not more than 0.1 atm.

Among these carrier gases, hydrogen and helium are preferred because the kinetic viscosity is large and a convection does not easily arise. Helium is expensive in comparison with the other gas and the crystallinity of the compound semiconductor is not good as described above when using hydrogen. Since nitrogen gas and argon are comparatively inexpensive, they can be suitably used when using a large amount of the carrier gas.

Next, the second part of the present invention will be explained.

The light-emitting device in the present invention is characterized by having a structure that a ground layer of a Group III-V compound semiconductor represented by the general formula $In_aGa_bAl_cN$ (provided that $0 \leq a < 1$, $0 < b < 1$, $0.05 \leq c < 1$, and $a+b+c=1$), a luminous layer of a Group III-V compound semiconductor represented by the general formula $In_xGa_yAl_zN$ (provided that $0 < x \leq 1$, $0 \leq y < 1$, $0 \leq z < 1$, and $x+Y+z=1$) and a protective layer of a Group III-V compound semiconductor represented by the general formula $In_{a'}Ga_{b'}Al_{c'}N$ (provided that $0 \leq a' < 1$, $0 < b' \leq 1$, $0 \leq c' < 1$, and $a'+b'+c'=1$) are laminated to each other in this order. The luminous layer has a band gap smaller than that of the ground layer and protective layer, and a laminated structure of these three layers forms a so-called quantum well structure. Since the ground layer and the protective layer have an action of injecting charges into the luminous layer, these two layers are sometimes referred to as a "charge injection layer", hereinafter.

Figure 2:
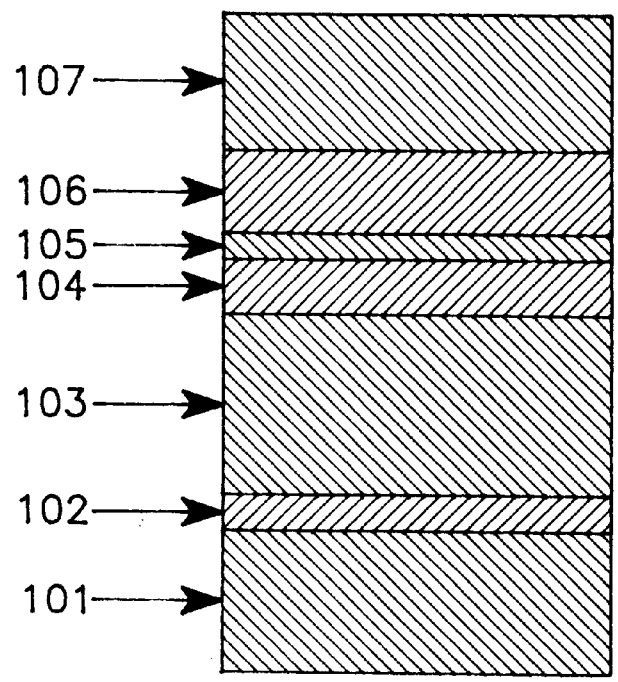
FIG. 2 is a sectional view illustrating one embodiment of the Group III-V compound semiconductor used for the light-emitting device of the present invention.

One embodiment of the structure of the Group III-V compound semiconductor of the present invention is shown in FIG. 2. FIG. 2 illustrates an embodiment wherein a buffer layer 102, an n type GaN layer 103, a ground layer 104, a luminous layer 105, a protective layer 106 and a p type layer 107 are laminated on a substrate 101 in this order. A current is injected by providing an n electrode on the n type layer 103, providing a p electrode on the p type layer 107 and then applying a voltage in the forward direction, thereby obtaining an emission from the luminous layer 105. As the luminous layer and protective layer, there can be used the same one as that described with respect to the first part of the present invention.

The ground layer will be explained hereinafter.

The ground layer is characterized in that the AlN mixed crystal ratio is within the range from 0.05 to 1. When the AlN mixed crystal ratio is smaller than 0.05, a change in luminescence wavelength is small and the effect of the present invention is not obtained. The AlN mixed crystal ratio is preferably from not less than 0.1, more preferably not less than 0.15. When the AlN mixed crystal ratio exceeds 0.9, the driving voltage sometimes become high and, therefore, it is not preferred. Accordingly, the AlN mixed crystal ratio is preferably not more than 0.9.

The film thickness of the ground layer is preferably within the range from 10 Å to 1 μm. When the film thickness of the ground layer is smaller than 10 Å, the effect of the present invention is not remarkable. On the other hand, when the film thickness of the ground layer exceeds 1 μm, it takes a long time to grow the ground layer and, therefore, it is not suitable for practical use.

The ground layer of the present invention may be doped with the impurity within the range where the crystallinity is not lowered. When the ground layer is doped in an n type, the characteristics of the light-emitting device such as driving voltage, luminous efficacy and the like are sometimes improved and, therefore, it is preferred. A specific example of the preferred range of the doping amount includes a carrier concentration within the range from $1\times10^{16}$ $cm^{-3}$ to $1\times10^{22}$ $cm^{-3}$. More preferably, the range of the carrier concentration of the ground layer is from $1\times10^{17}$ $cm^{-3}$ to $1\times10^{21}$ $cm^{-3}$. When the carrier concentration is smaller than $1\times10^{16}$ $cm^{-3}$, the injection efficacy of the charge is not sufficient sometimes. On the other hand, when the carrier concentration is larger than $1\times10^{22}$ $cm^{-3}$, the crystallinity of the ground layer is deteriorated and the luminous efficacy is sometimes lowered.

One layer or a plurality of layers of the n type or non-doped compound semiconductor may be interposed between the ground layer and substrate. As is explained in the first part of the present invention, a structure wherein a plurality of thin films of the compound semiconductor having a different lattice constant are laminated is particularly preferred because the crystallinity of a layer to be grown thereon is sometimes improved.

In the laminated structure of the ground layer, luminous layer and protective layer, which was explained above, the lattice constant of the luminous layer may be made larger than that of the ground layer so as to obtain a structure wherein a compressive stress is applied to the luminous layer in the joining direction, i.e. a structure wherein a compressive stress is applied in the direction in parallel to the joining interface. In order to obtain such a structure, for example, a process of making the InN mixed crystal ratio of the luminous layer larger than that of the ground layer can be used.

Even if the InN mixed crystal ratio of the luminous layer is made larger than that of the ground layer, a misfit dislocation is formed on the interface between the luminous layer and ground layer according to the process or condition of growing these layers, and the lattice relaxation of the luminous layer arises and the compressive stress is not applied to the luminous layer. Therefore, the luminous layer having high crystallinity can not be obtained, sometimes. When maintaining it at high temperature (exceeding 1000° C.) for a long time after growing the luminous layer without forming the protective layer or when growing the protective layer at high temperature (exceeding 1000° C.), thermal deterioration of the luminous layer sometimes proceeds. In this respect, the growing temperature is preferably not more than 1000° C. in the crystal growth of the protective layer.

As the substrate and growing process which are used in the present invention, there can be used the same one as that described with respect to the first part of the present invention.

EXAMPLES

The following Examples further illustrate the present invention in detail but are not to be construed to limit the scope thereof.

Example 1

Figure 3:
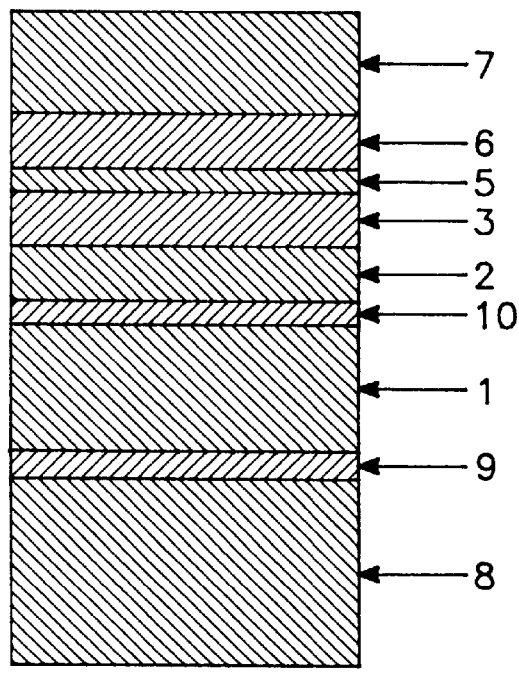
FIG. 3 is a sectional view illustrating the light-emitting device of the present invention made in Example 1.

A Group III-V compound semiconductor having the structure of FIG. 3 was made by a MOVPE process.

The sapphire C surface was mirror-polished and washed with an organic solvent, and then the resultant was used as a substrate 8. As the growing process, a two-step growth method using GaN as a low-temperature grown buffer layer was used. A GaN buffer layer 9 having a thickness of about 300 Å (550° C.), an n type layer 1 of GaN doped with Si having a thickness of about 2.5 μm (1050° C.) and a non-doped GaN layer 10 having a thickness of 1500 Å were grown under a pressure of 1/8 atmosphere by using hydrogen as the carrier gas.

Then, an $In_{0.3}Ga_{0.7}N$ layer doped with Si as the strained layer 2 was grown at the substrate temperature of 750° C. for 70 seconds by feeding nitrogen as the carrier gas, TEG, TMI, silane diluted to 1 ppm with nitrogen and ammonia in the amount of 4 slm, 0.04 sccm, 0.6 scam, 5 sccm and 4 slm, respectively. Furthermore, an n type layer 3 of $Ga_{0.8}Al_{0.2}N$ doped with Si was grown at the same temperature for 10 minutes by feeding TEG, TEA, the above silane and ammonia in the amount of 0.032 scam, 0.008 sccm, 5 sccm and 4 slm, respectively.

Provided that "slm" and "sccm" mean units of gas flow. "1 slm" means that a gas occupying 1 liter of a volume per minute in the normal state flows, and "1000 scam" corresponds to "1 slm".

Regarding the film thickness of the layer 2 and layer 3, the growing rates determined from the thickness of the layer grown under the same condition for a long time are 43 Å/minute and 30 Å/minute, respectively. Therefore, the film thickness determined by calculating from the above growing time is 50 Å and 300 Å, respectively.

After growing the n type layer 3, a luminous layer 5 (50 Å) of non-doped $In_{0.3}Ga_{0.7}N$ and a charge injection layer 6 (300 Å) of non-doped $Ga_{0.8}Al_{0.2}N$ were grown at the substrate temperature of 785° C. under the growing pressure of 1 atm.

After growing the charge injection layer 6, a p type layer 7 (5000 Å) of GaN doped with Mg was grown at the substrate temperature of 1100° C. The sample thus made was heat-treated in nitrogen at 800° C. under a pressure of 1 atm for 20 minutes to reduce the resistance of the layer doped with Mg.

In the above embodiment, the layers 9, 1, 10, 2 and 3 are ground layers. The layer 3 also serves as the charge injection layer.

According to a normal process, electrodes were formed on the sample thus obtained to give LED. A Ni-Au alloy was used as the p electrode and Al was used as the n electrode. A current (20 mA) was passed through this LED in the forward direction. As a result, it emitted clear blue light. The center wavelength of the emission peak was 4800 Å and the luminance was 860 mcd.

Comparative Example 1

According to the same manner as that described in Example 1 except for growing a luminous layer 5, a charge injection layer 6 and a p type layer 7 of GaN doped with Mg, after growing a non-doped GaN layer 10, an LED was made, and then the LED was evaluated according to the same manner as that described in Example 1. As a result, it emitted clear blue light and the luminance was 390 mcd.

Example 2

According to the same manner as that described in Example 1 except that the layer 3 is GaN doped with Si, an LED was made, and then the LED was evaluated according to the same manner as that described in Example 1. As a result, the luminance was 630 mcd (center wavelength of emission peak: 4600 Å, quantum efficacy of external quantum: 0.8%).

Example 3

According to the same manner as that described in Example 1 except for growing a GaN layer 7 doped with Mg under the growing pressure of 1 atm after growing a non-doped InGaN luminous layer at 750° C. under 1/8 atm using TEG and TMI in the amount of 0.04 sccm and 0.6 sccm, respectively, and growing a charge injection layer 6 of non-doped $Ga_{0.8}Al_{0.2}N$ at 750° C. under 1/8 atm using TEG and TEA in the amount of 0.032 sccm and 0.008 sccm, respectively, an LED was made, and then the LED was evaluated according to the same manner as that described in Example 1. As a result, the luminance was 520 mcd and a center wavelength of an emission peak was 4600 Å.

Comparative Example 2

According to the same manner as that described in Example 3 except for growing a luminous layer 5, a charge injection layer 6 and a GaN layer 7 doped with Mg without growing a strained layer 2 and a $Ga_{0.8}Al_{0.2}N$ layer 3 after growing a non-doped GaN layer 10, an LED was made. Then, the LED was evaluated according to the same manner as that described in Example 1. As a result, it emitted very weak light and the luminance was not more than $10^{-4}$ cd.

Example 4

According to the same manner as that described in Example 3 except for forming a structure obtained by growing a strained layer 2 and a $Ga_{0.8}Al_{0.2}N$ layer 3 twice after growing a non-doped GaN layer 10, an LED was made. Then, the LED was evaluated according to the same manner as that described in Example 1. As a result, the luminance was 240 mcd.

Example 5

According to the same manner as that described in Example 3 except for growing a $Ga_{0.7}Al_{0.3}N$ layer 3 in place of the $Ga_{0.8}Al_{0.2}N$ layer 3 after growing a strained layer 2, an LED was made. Then, the LED was evaluated according to the same manner as that described in Example 1. As a result, the center wavelength of the emission peak was 5050 Å and the luminance was 320 mcd. The luminescence wavelength became longer than that of Example 3.

Example 6

Figure 4:
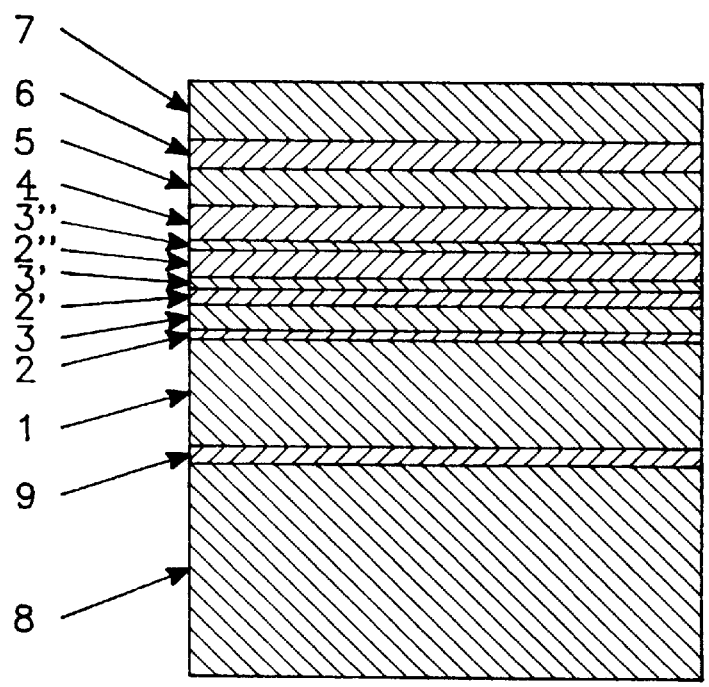
FIG. 4 is a sectional view illustrating the light-emitting device of the present invention shown in Example 6.

A Group III-V compound semiconductor as shown in FIG. 4 is grown by vapor phase epitaxy according to a MOVPE process to make an LED having a luminescence wavelength of 5100 Å.

After GaN (500 Å) as a buffer layer 9 is formed on a sapphire (0001) substrate 8 at the growing temperature of 600 under a pressure of 1/8 atm, using TMG and ammonia, a GaN layer doped with Si was grown at 1100° C. in the thickness of 3 μm.

A $In_{0.3}Ga_{0.6}Al_{0.1}N$ layer doped with Si and a $Ga_{0.8}Al_{0.2}N$ layer doped with Si are repeatedly grown six times to form a ground layer, and then a charge injection layer 4 of an $In_{0.3}Ga_{0.6}Al_{0.1}N$ layer doped with Si is grown.

A luminous layer 5 of an $In_{0.5}Ga_{0.5}N$ layer (150 Å) is grown, and then a $Ga_{0.8}Al_{0.2}N$ layer is grown in the thickness of 300 Å.

Then, a GaN layer 7 doped with Mg is grown in the thickness of 5000 Å. After the growth, the substrate is unloaded from the reactor and heat-treated in nitrogen at 800° C. to reduce the resistance of the Mg-doped GaN layer.

LED having a sharp emission spectrum can be made by forming electrodes on the sample thus obtained according to a normal process.

Example 7

A GaN buffer layer 102 having the thickness of about 300 Å (substrate temperature: 550° C., growing pressure: 1 atm), an n type layer 103 having the thickness of about 3 μm of GaN doped with Si (1100° C.) and a layer 104 (1500 Å) of n type Ga0.8Al0.2N doped with Si were grown, using hydrogen as the carrier gas.

Then, a luminous layer of non-doped $In_{0.3}Ga_{0.7}N$ (50 Å) was grown at the substrate temperature of 800° C. by feeding nitrogen as the carrier gas, TEG, TMI and ammonia in the amount of 4 slm, 0.04 sccm, 0.24 sccm and 4 slm, respectively.

Furthermore, a protective layer 106 (300 Å) of non-doped $Ga_{0.8}Al_{0.2}N$ was grown at the same temperature by feeding TEG, TEA and ammonia in the amount of 0.032 sccm, 0.008 sccm and 4 slm, respectively.

After growing the protective layer 106, the temperature of the substrate was raised to 1100° C. and a p type layer 107 (5000 Å) of GaN doped with Mg was grown. The sample thus made was heat-treated in nitrogen at 800° C. under 1 atm for 20 minutes to reduce the resistance of the Mg-doped layer.

According to a normal process, electrodes were formed on the sample thus obtained to give a light-emitting device. A Ni-Au alloy was used as the p electrode and Al was used as the n electrode. A current (20 mA) was passed through this light-emitting device in the forward direction. As a result, it emitted clear blue light. A center wavelength of an emission peak was 4800 Å.

According to the same manner as that described in the above Example except for using non-doped GaN as the ground layer 4, a sample was made.

The sample thus obtained was evaluated. As a result, the luminescence wavelength was 4500 Å at 20 mA.

According to the same manner as that described in the above Example, a quantum well structure, wherein non-doped GaN (1100° C.), a non-doped InGaN active layer (800° C.) and a non-doped GaAlN protective layer (the same temperature) are laminated, was made and a lattice image was observed by using an electron microscope. As a result, formation of a misfit dislocation was not observed at the interfaces of the luminous layer. Since the lattice constant of InGaN is larger than that of GaN, a misfit dislocation is not formed before and after the quantum well structure. Therefore, it is clear that a compressive stress is applied to the InGaN layer in the interface direction.

Example 8

According to the same manner as that described in Example 7 except for growing non-doped GaN in place of n type $Ga_{0.8}Al_{0.2}N$ doped with Si and growing n type $Ga_{0.6}Al_{0.4}N$ (600 Å) at 800° C. as the ground layer 104, using nitrogen as the carrier gas, a sample was made, and then the sample was evaluated according to the same manner as that described in Example 1. As a result, it was observed to emit clear green light. The luminescence wavelength at 1 mA was 5200 Å.

The Group III-V compound semiconductor of the present invention has high crystallinity and high quality, and a light-emitting device using the same has high luminous efficacy and therefore its industrial value is large.

The light-emitting device using the Group III-V compound semiconductor of the present invention can inhibit formation of a misfit dislocation on the interface of the luminous layer and easily emits light having a longer wavelength. Therefore, the luminescence wavelength can be easily conducted in a wide range and consequently industrial value is also large.

What is claimed is:

1. A Group III-V compound semiconductor comprising at least a luminous layer and a charge injection layer on a substrate, the luminous layer being a Group III-V compound semiconductor represented by the general formula $In_xGa_yAl_zN$ wherein $0<x\leq1$, $0\leq y<1$, $0\leq z<1$, and $x+y+z=1$, the charge injection layer being a Group III-V compound semiconductor which is represented by the general formula $In_{x'}Ga_{y'}Al_{z'}N$ wherein $0\leq x'\leq1$, $0\leq y'\leq1$, $0\leq z'1$, and $x'+y'+z'=1$ and which has a band gap larger than that of the luminous layer, the luminous layer being interposed between two charge injection layers in contact therewith which comprises a ground layer composed of at least three layers between the luminous layer and substrate, each layer constituting the ground layer being a Group III-V compound semiconductor represented by the general formula $In_uGa_vAl_wN$ wherein $0\leq u\leq1$, $0\leq u\leq1$, $0\leq w\leq1$, and $u+v+w=1$, at least one layer in the ground layer being interposed between two layers having an InN mixed crystal ratio smaller than that of the layer in contact therewith, the InN mixed crystal ratio of the layer interposed between the two layers having a smaller InN mixed crystal ratio that is 0.05 or more larger than that of the layer in contact with the layer from the substrate side, and at least one layer between the layer at the substrate side among the two layers having a smaller InN mixed crystal ratio and wherein the luminous layer is doped with an n type impurity.

2. The Group III-V compound semiconductor according to claim 1, wherein the charge injection layer at the substrate side among the charge injection layers sandwiching the luminous layer in contact with it also serves as the layer at the luminous layer side among the two layers having a smaller InN mixed crystal ratio, which sandwich the layer having a larger InN mixed crystal ratio in contact therewith, in the ground layer.

3. The Group III-V compound semiconductor according to claim 1 or 2, wherein the n type impurity is Si and/or Ge and wherein the concentration of the n type impurity is not less than $1 \times 10^{17}$ cm$^{-3}$.

4. The Group III-V compound semiconductor according to claim 1 or 2, wherein the thickness of the layer interposed between two layers having a smaller InN mixed crystal ratio in the ground layer is within the range from 5 to 300 Å.

5. The Group III-V compound semiconductor according to claim 1 or 2, wherein the ground layer composed of at least three layers is a Group III-V compound semiconductor obtained by growing under a pressure within the range from 0.001 to 0.8 atm according to an organometallic vapor phase epitaxy process.

6. The Group III-V compound semiconductor according to claim 1 or 2, wherein at least one layer in the ground layer is sandwiched between two layers having an InN mixed crystal ratio which is smaller than that of the layer in contact therewith and when the InN mixed crystal ratio of the layer interposed between the two layers has a smaller InN mixed crystal ratio larger than that of the layer in contact with the layer from the substrate side by 0.05 to 0.3, the product of the difference in mixed crystal ratio between the layers and the thickness (Å) of the layer interposed between the two layers having a smaller InN mixed crystal ratio is not more than 30 and further when the InN mixed crystal ratio of the layer interposed between the two layers has a smaller InN mixed crystal ratio larger than that of the layer in contact with the layer from the substrate side by 0.3 or more, the thickness of the layer interposed between the two layers having a smaller InN mixed crystal ratio is not more than 100 Å.

7. A light-emitting device comprising the Group III-V compound semiconductor of claim 1 or 2.

8. A light-emitting device comprising a structure comprising a ground layer of a Group III-V compound semiconductor represented by the general formula In$_a$Ga$_b$Al$_c$N wherein $0 \leq a < 1$, $0 < b < 1$, $0.05 \leq c < 1$, and $a+b+c=1$, a luminous layer of a Group III-V compound semiconductor which is represented by the general formula In$_x$Ga$_y$Al$_z$N wherein $0 < x \leq 1$, $0 \leq y < 1$, and $0 \leq z < 1$, and $x+Y+z=1$ and which has a band gap smaller than that of the ground layer, and a protective layer of a Group III-V compound semiconductor which is represented by the general formula In$_{a'}$Ga$_{b'}$Al$_{c'}$N wherein $0 \leq a' < 1$, $0 < b' \leq 1$, $0 \leq c' < 1$, and $a'+b'+c'=1$ and which has a band gap larger than that of the luminous layer are laminated to each other in this order to form joining interfaces, and further wherein the lattice constant of the luminous layer is larger than that of the ground layer and a compressive stress is applied to the luminous layer in a direction parallel to the joining interfaces and a film thickness of the luminous layer is within a range of about 5 to 90 Å.

9. The light-emitting device according to claim 8, wherein a concentration of an n type carrier of the ground layer of claim 8 is within the range from $1 \times 10^{16}$ cm$^{-3}$ to $1 \times 10^{21}$ cm$^{-3}$.

10. The light-emitting device according to claim 8 or 9, wherein a concentration of Si, Ge, Zn, Cd or Mg is not more than $1 \times 10^{19}$ cm$^{-3}$.

11. A process for producing the light-emitting device of claim 8 or 9, which comprises growing the protective layer of claim 8 at a temperature of not more than 1000° C.

12. The light-emitting device according to claim 8 or 9, wherein a concentration of Mg contained in the protective layer is not more than $1 \times 10^{19}$ cm$^{-3}$.

* * * * *